United States Patent [19]

Kato

[11] Patent Number: 5,424,982
[45] Date of Patent: Jun. 13, 1995

[54] SEMICONDUCTOR MEMORY DEVICE HAVING TWO DIFFERENT OUTPUT BUFFERS FOR ONE OUTPUT TERMINAL

[75] Inventor: Yasushi Kato, Tokyo, Japan
[73] Assignee: NEC Corporation, Tokyo, Japan
[21] Appl. No.: 94,965
[22] Filed: Jul. 22, 1993

[30] Foreign Application Priority Data

Jul. 28, 1992 [JP] Japan ................................ 4-201568

[51] Int. Cl.$^6$ ............................................. G11C 17/08
[52] U.S. Cl. ................................. 365/189.05; 326/62; 326/105; 326/136
[58] Field of Search ...................... 365/189.05, 189.01; 307/449, 463, 473

[56] References Cited

FOREIGN PATENT DOCUMENTS 3-116498  5/1991  Japan.

*Primary Examiner*—Viet Q. Nguyen
*Attorney, Agent, or Firm*—Sughrue, Mion, Zinn, Macpeak & Seas

[57] ABSTRACT

An internal read data signal passes through an output buffer to an output terminal. An identification code signal passes through an output buffer to the output terminal. These two output buffers are enabled and disabled in accordance with a data output enable signal and a code output enable signal.

6 Claims, 6 Drawing Sheets

Fig. 4

| $A_0$ | $DO_0$ | $DO_1$ | $DO_2$ | ... | $DO_7$ |
|---|---|---|---|---|---|
| 0 | 0 | 1 | 0 | ... | 1 |
| 1 | 0 | 1 | 1 | ... | 0 |

SEMICONDUCTOR MEMORY DEVICE HAVING TWO DIFFERENT OUTPUT BUFFERS FOR ONE OUTPUT TERMINAL

BACKGROUND OF THE INVENTION

1. Field of the Invention

The present invention relates to a semiconductor memory device such as a programmable read-only memory (PROM) incorporating a logic generating circuit for an identification code including a manufacturer's code and a device code.

2. Description of the Related Art

Generally, semiconductor memory devices such as PROM's incorporate logic circuits for generating identification codes indicating the function thereof. For example, in a PROM, an identification code is utilized to specify a programming process applied thereto. In this case, the identification code is output before a programming mode to indicate a programming voltage such as 21 V, 12 V, or the like for the PROM. Then, a writing operation is actually performed by a programming device upon the PROM by using the identified voltage.

In a prior art PROM, a logic circuit for generating an identification code is interposed within a data path for passing an internal read data signal to an output terminal. As a result, such a logic circuit is a hindrance to high-speed transmission of an internal read data signal, thus reducing the speed of the read operation. This will be explained later.

SUMMARY OF THE INVENTION

It is an object of the present invention to output internal read data at high speed in a semiconductor memory device such as a PROM incorporating a logic circuit for generating an identification code.

According to the present invention, an internal read data signal passes through an output buffer to an output terminal and an identification code signal passes through an output buffer to the output terminal. These two output buffers are enabled and disabled in accordance with a data output enable signal and a code output enable signal.

BRIEF DESCRIPTION OF THE DRAWINGS

The present invention will be more clearly understood from the description as set forth below, as compared with the prior art, with reference to the accompanying drawings, wherein:

FIG. 4 is a diagram showing an example of an identification code;

DESCRIPTION OF THE PREFERRED EMBODIMENT

Before the description of an embodiment of the present invention, a prior art semiconductor memory device capable of outputting identification codes will be explained with reference to FIGS. 1, 2, 3, 4, and 5A through 5D.

Figure 1:
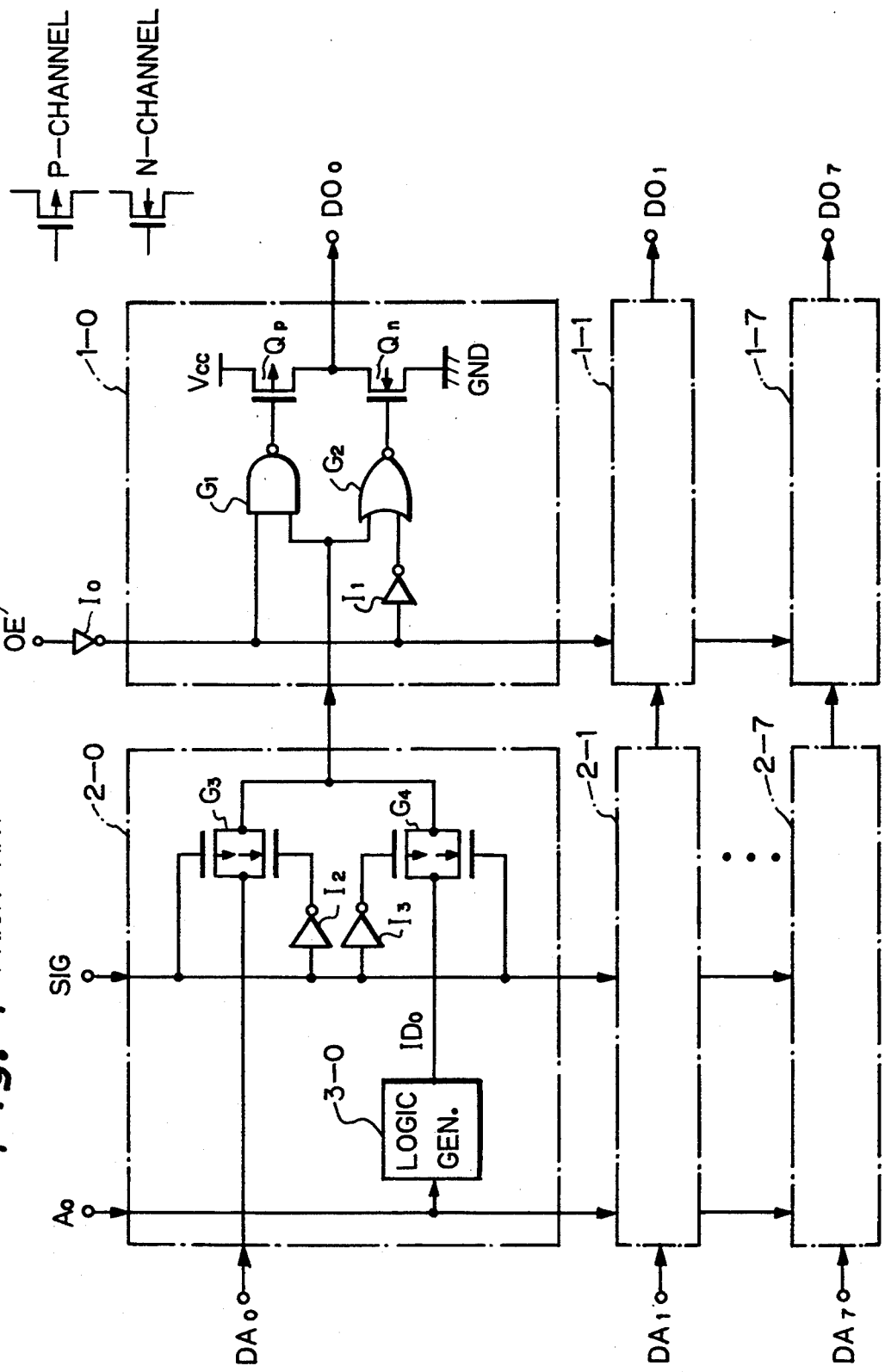
FIG. 1 is a circuit diagram illustrating a prior art semiconductor memory device.

In FIG. 1, which illustrates a prior art semiconductor memory device, assume that eight output terminals $DO_0$, $DO_1$, ..., $DO_7$ are provided. In this case, eight output buffers 1-0, 1-1, ..., 1-7 are connected to the output terminals $DO_0$, $DO_1$, ..., $DO_7$, respectively, and eight logic circuits 2-0, 2-1, ..., 2-7 are connected to the output buffers 1-0, 1-1, ..., 1-7, respectively.

Each of the output buffers 1-0, 1-1, ..., 1-7 is formed by a P-channel metal-oxide-semiconductor (MOS) transistor $Q_F$ and an N-channel MOS transistor $Q_n$ between a positive power supply Vcc and a ground GND, a NAND circuit $G_1$ for controlling the P-channels MOS transistor $Q_P$, an inverter $I_1$ and a NOR circuit $G_2$ for controlling the N-channel MOS transistor $Q_n$. A data output enable signal OE' is commonly supplied via an inverter $I_0$ to all of the output buffers 1-0, 1-1, ..., 1-7.

When the data output enable signal OE' is inactive (i.e., logic "1"), the NAND circuit $G_1$ and the NOR circuit $G_2$ are both disabled. That is, the output signal of the NAND circuit $G_1$ is high to thereby turn OFF the P-channel MOS transistor $Q_P$, and also, the output signal of the NOR circuit $G_2$ is low to thereby turn OFF the N-channel transistor $Q_n$. As a result, all of the output terminals $DO_0$, $DO_1$, ..., $DO_7$ are in a high-impedance state.

Conversely, when the data output enable signal OE' is active (i.e., logic "0"), the NAND circuit $G_1$ and the NOR circuit $G_2$ are both enabled. That is, the NAND circuit $G_1$ generates an inverted signal of the output signal of the logic circuit such as 2-0, and also, the NOR circuit $G_2$ generates an inverted signal of the output signal of the logic circuit such as 2-0. Therefore, the P-channel MOS transistor $Q_P$ and the N-channel MOS transistor $Q_n$ are controlled by the inverted signal of the output signal of the logic circuit such as 2-0, and as a result, the potentials at the output terminals $DO_0$, $DO_1$, ..., $DO_7$ are the same as those at the outputs of the logic circuits 2-0, 2-1, ..., 2-7, respectively.

Figure 2:
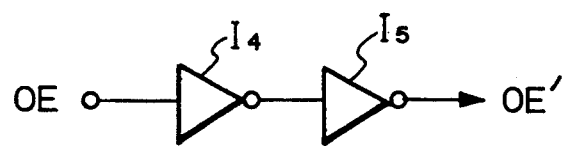
FIG. 2 is a circuit diagram illustrating a data output enable signal generating circuit for the data output enable signal of FIG. 1.

Note that the data output enable signal OE' is generated from a data output enable signal OE by a series of inverters $I_4$ and $I_5$, as illustrated in FIG 2.

Next, the logic circuit, using 2-0 as an example, is explained. The logic circuit 2-0 is formed by transfer gates $G_3$ and $G_4$, inverters $I_2$ and $I_3$, and a logic generating circuit 3-0 for generating an identification code signal $ID_0$. In this case, the transfer gate $G_3$ receives an internal read data signal $DA_0$ from the memory cells (not shown), while the transfer gate $G_4$ receives the identification code signal $ID_0$. Therefore, the logic circuit 2-0 generates either the internal read data signal $DA_0$ or the identification code signal $ID_0$ in accordance with a code output enable signal SIG.

Figure 3:
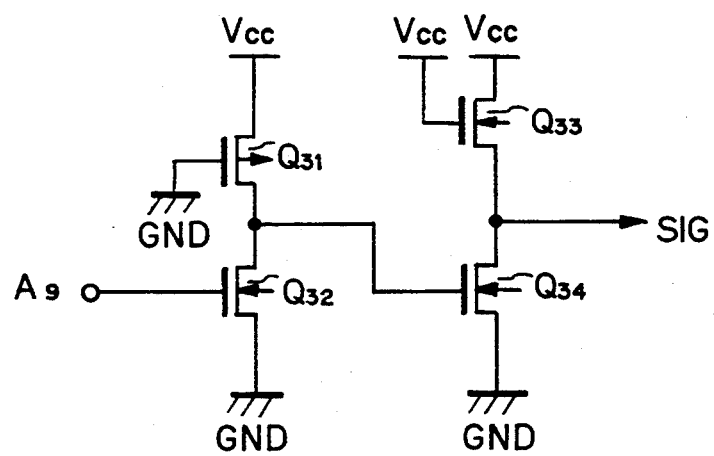
FIG. 3 is a circuit diagram illustrating an identification code output enable signal generating circuit for the identification code output enable signal of FIG. 1.

Note that the code output enable signal SIG is generated by a comparator formed by a P-channel MOS transistor $Q_{31}$ and N-channel MOS transistors $Q_{32}$, $Q_{33}$ and $Q_{34}$, as illustrated in FIG. 3. In this case, the N-channel MOS transistor $Q_{32}$ has an especially high threshold voltage such as 9 V, and therefore, the comparator compares the potential at a special address port such as $A_9$ with 9 V. When the potential at the address port $A_9$ is not higher than 9 V, the code output enable signal SIG is low, while when the potential at the address port $A_9$ is higher than 9 V, the code output enable signal SIG is high.

Figure 4:
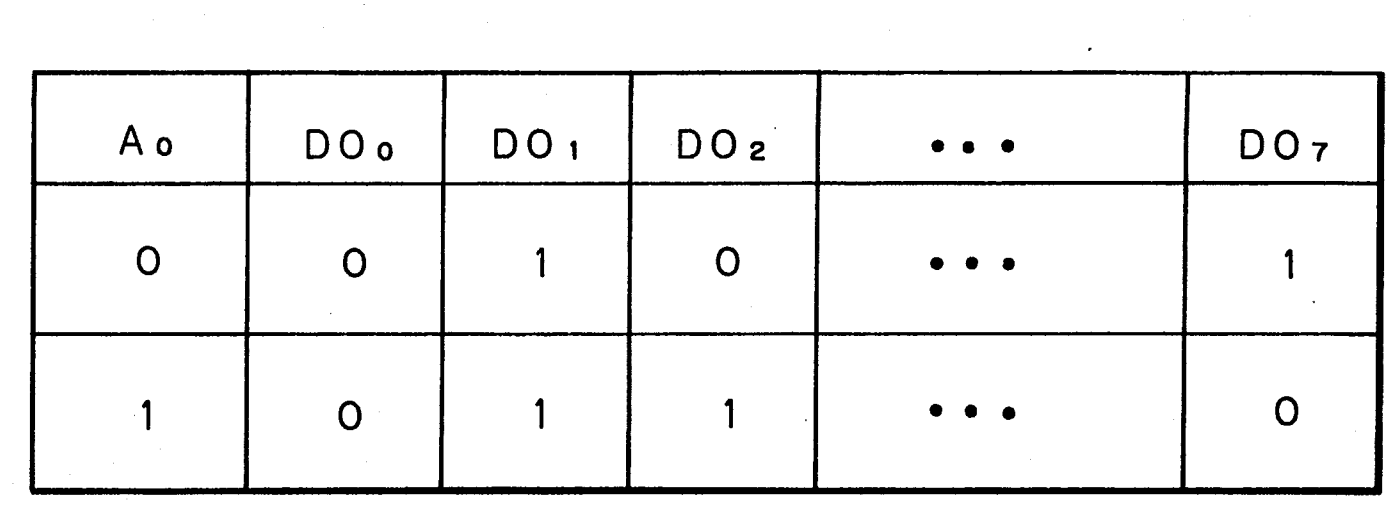
Figure 5A:
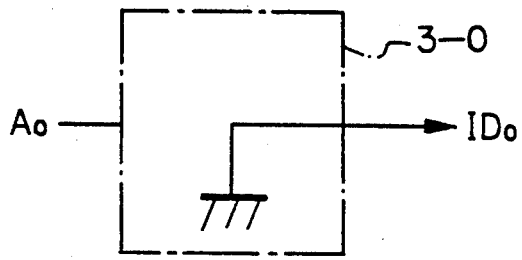
FIGS. 5A, 5B, 5C and 5D are detailed circuit diagrams of the logic generating circuit of FIG. 1.
Figure 5B:
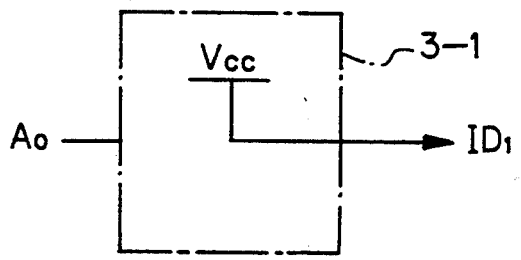
Figure 5C:
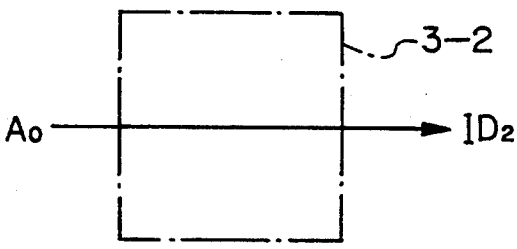
Figure 5D:
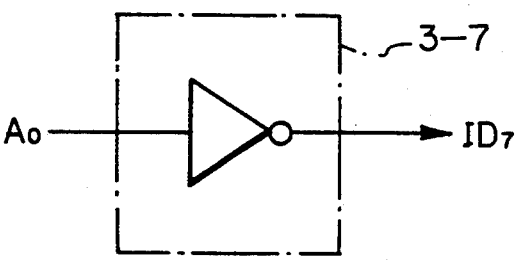

As shown in FIG. 4, an example of identification code is formed by 16 bits "010 ... 1011 ... 0". In FIG. 1, since the number of output terminals is eight, the output terminals $DO_0$, $DO_1$, ..., $DO_7$ are duplexed by using an address signal $A_0$. For example, since the data at the output terminal $DO_0$ is "0" ($A_0$="0") and "0" ($A_0$="1"), the logic generating circuit 3-0 is constructed by a circuit as illustrated in FIG. 5A. Also since the data at the output terminal $DO_1$ is "1" ($A_0$="0") and "1" ($A_0$="1"), the logic generating circuit 3-1 is constructed by a circuit as illustrated in FIG. 5B. Further, since the data at the output terminal $DO_2$ is "0" ($A_0$="0") and "1" ($A_0$="1"), the logic generating circuit 3-2 is constructed by a circuit as illustrated in FIG. 5C. Further, since the data at the output terminal $DO_7$ is "1" ($A_0$="0") and "0" ($A_0$="1"), the logic generating circuit 3-7 is constructed by a circuit as illustrated in FIG. 5D. That is, each of the logic generating circuits can be constructed by one of the circuits as illustrated in FIGS. 5A, 5B, 5C and 5D.

Thus, in the prior art semiconductor device of FIG. 1, the logic circuit such as 2-0 is controlled by the code output enable signal SIG to generate either an internal read data signal such as $DA_0$ or an identification code signal such as $ID_0$, and the output buffer such as 1-0 is controlled by the output enable signal OE' to generate the same logic signal as the output signal of the logic circuit 2-0.

Incidentally, in recent years, as the access speed of central processing units (CPU's) has been increased, it is also required to operate semiconductor memory devices such as PROM's at higher speeds. For this purpose, paths for read data have been simplified in a layout form or in a circuit form by reducing the stages of transistors and the load capacity as much as possible. In view of this, since the logic circuits 2-0, 2-1, ..., 2-7, particularly, the transfer gates $G_3$, which have large resistances, are interposed in the paths for read data, this is a hindrance to high-speed read operation, and accordingly, the semiconductor memory device as illustrated in FIG. 1 is disadvantageous.

Figure 6:
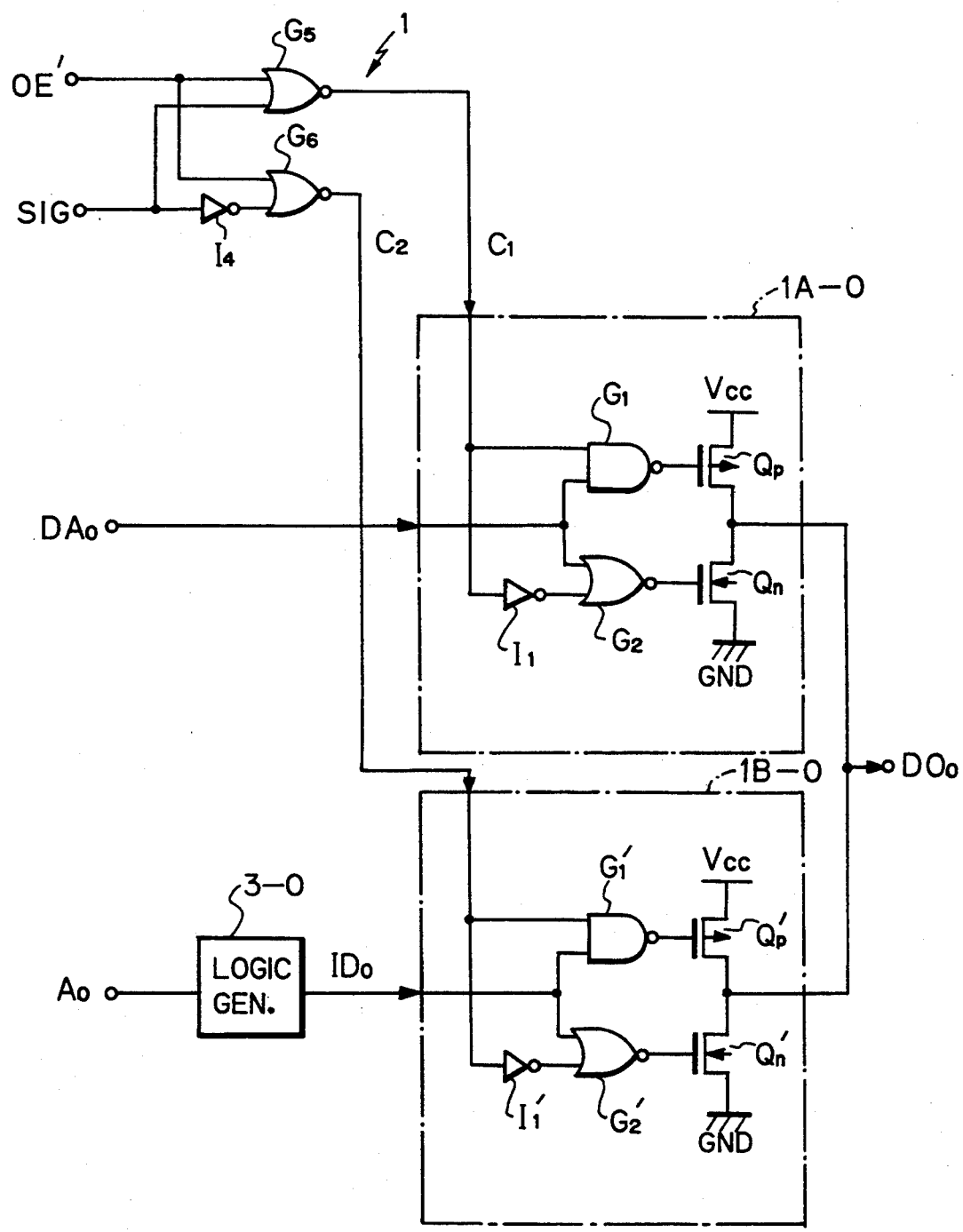
FIG. 6 is a circuit diagram illustrating an embodiment of the semiconductor memory device according to the present invention.

In FIG. 6, which illustrates an embodiment of the present invention, only one output terminal $DO_0$ is illustrated and the other output terminals are omitted for simplification of the description. In FIG. 6, there are provided two kinds of output buffers 1A-0 and 1B-0 each having the same configuration as the output buffer 1-0 of FIG. 1. According to the present invention the internal read data signal $DA_0$ is supplied directly to the output buffer 1A-0, and also, the identification code signal $ID_0$ is supplied directly to the output buffer 1B-0. The logic circuit 2-0 is not provided except for the logic generating circuit 3-0. That is, a path for the read data signal $DA_0$ is different from a path for the identification code signal $ID_0$.

The two output buffers 1A-0 and 1B-0 are controlled commonly by an enable control circuit 1 which receives the data output enable signal OE' and the code output enable signal SIG to generate two control signals $C_1$ and $C_2$ for controlling the output buffers 1A-0 and 1B-0, respectively. In this case, only one of the output buffers 1A-0 and 1B-0 is enabled, so that no conflict occurs at the output terminal $DO_0$.

The enable control circuit 1 includes two NOR circuits $G_5$ and $G_6$, and an inverter $I_4$. That is, when the data output enable signal OE' is inactive (i.e., logic "1"), the NOR circuits $G_5$ and $G_6$ make the control signals $C_1$ and $C_2$ low (i.e., logic "0") in spite of the code output enable signal SIG being "0" and "1". Therefore, the NAND circuit $G_1$ and the NOR circuit $G_2$ of the output buffer 1A-0 and the NAND circuit $G_1'$ and the NOR circuit $G_2'$ of the output buffer 1B-0 are disabled, and accordingly, the output buffers 1A-0 and 1B-0 are both disabled so that the output terminal $DO_0$ is in a high-impedance state.

When the code output enable signal SIG is "0" under the condition that the data output enable signal OE' is active (i.e., logic "0"), the NOR circuits $G_5$ and $G_6$ make the control signal $C_1$ and $C_2$ high (i.e., logic "1") and low (i.e., logic "0"), respectively. As a result, the output buffer 1A-0 is enabled so as to pass the internal read data signal $DA_0$ therethrough to the output terminal $DO_0$. Conversely, the output buffer 1B-0 is disabled, so that the identification code signal $ID_0$ cannot pass through the output buffer 1B-0.

Similarly, when the code output enable signal SIG is "1" under the condition that the data output enable signal OE' is active (i.e., logic "0"), the NOR circuits $G_5$ and $G_6$ make the control signal $C_1$ and $C_2$ low (i.e., logic "0") and high (i.e., logic "1"), respectively. As a result, the output buffer 1B-0 is enabled so as to pass the identification code signal $ID_0$ therethrough to the output terminal $DO_0$. Conversely, the output buffer 1A-0 is disabled, so that the internal read data signal $DA_0$ cannot pass through the output buffer 1A-0.

Note that the internal read data signal $DA_0$ requires a higher speed operation, and therefore, the P-channel MOS transistor $Q_P$ and the N-channel MOS transistor $Q_n$ are relatively large in size. Conversely, the identification code signal $ID_0$ per se does not require a particularly high speed, and therefore, the P-channel MOS transistor $Q_P'$ and the N-channel MOS transistor $Q_n'$ can be reduced in size.

Figure 7:
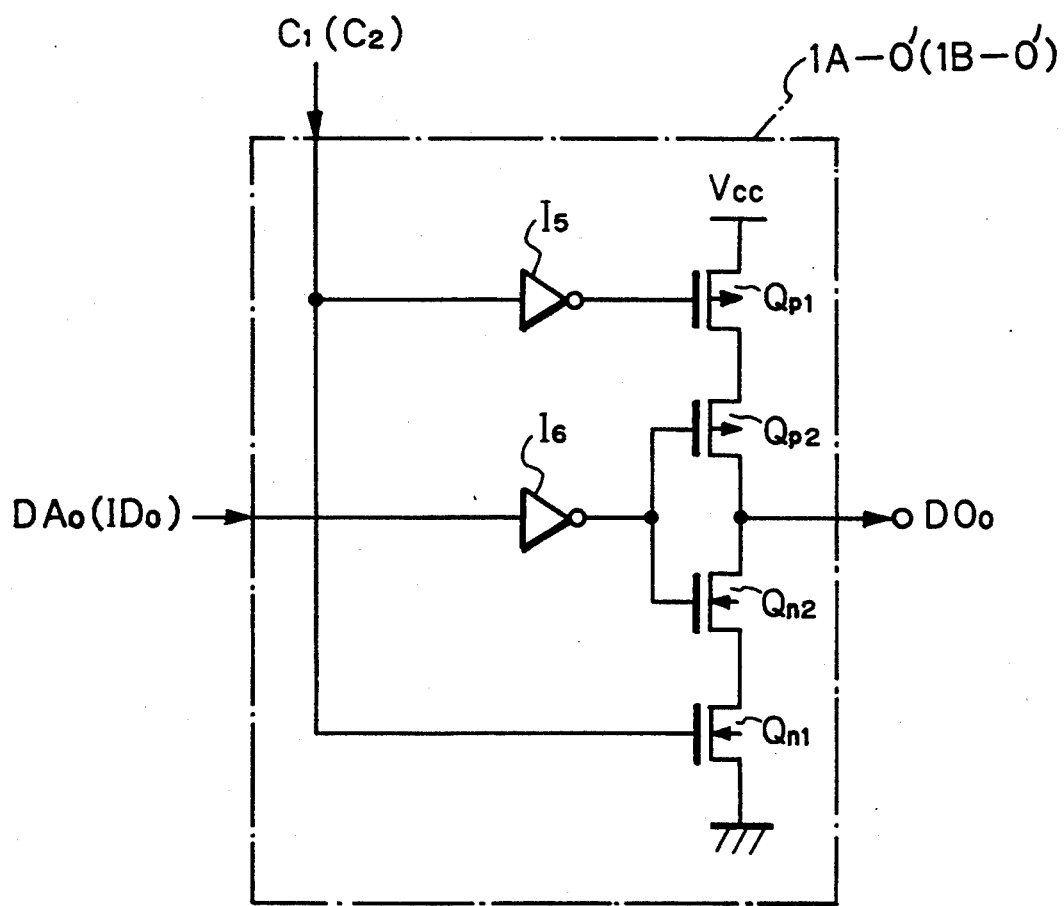
FIG. 7 is a circuit diagram of a modification of the output buffer of FIG. 6.

Also, the output buffers 1A-0 and 1B-0 can be modified. For example, as illustrated in FIG. 7, an output buffer 1A-0' (1B-0') can be used in place of the output buffer 1A-0' (1B-0'). In the output buffer 1A-0'(1B-0'), two P-channel MOS transistor $Q_{P1}$ and $Q_{P2}$ and two N-channel MOS transistors $Q_{n2}$ and $Q_{n1}$ are connected between Vcc and GND in this order. The gate of the P-channel MOS transistor $Q_{P1}$ receives the control signal $C_1$ (or $C_2$) via an inverter $I_5$, and the gate of the N-channel MOS transistor $Q_{n1}$ directly receives the control signal $C_1$ (or $C_2$). Also, the gates of the P-channel MOS transistor $Q_{P2}$ and the N-channel MOS transistor $Q_{n2}$ receive the internal read data signal $DA_0$ (or the identification code signal $ID_0$) via an inverter $I_6$.

As explained hereinbefore, according to the present invention, since the internal read data is directly supplied to the output buffer for the internal read data which is separated from the output buffer for the identification code signal, the internal read data can be output at high speed.

I claim:

1. A semiconductor memory device responsive to a data output enable signal and a code output enable signal, comprising:
    an output terminal;
    a first output buffer for passing an internal read data signal therethrough to said output terminal;

a second output buffer for passing an identification code signal therethrough to said output terminal;

a first NOR circuit receiving said data output enable signal and said code output enable signal to generate a first control signal for controlling said first output buffer;

an inverter for receiving said code output enable signal;

a second NOR circuit for receiving said data output enable signal and an output signal of said inverter to generate a second control signal for controlling said second output buffer; and wherein said first and second control signals respectively control said first and second output buffers according to the schedule;

disable said first and second output buffers when said data output enable signal is inactive;

enable said first output buffer and disable said second output buffer when said data output enable signal is active and said code output enable signal is inactive;

disable said first output buffer and enable said second output buffer when said data output enable signal is active and said code output enable signal is active.

2. A device as set forth in claim 1, wherein said first output buffer comprises:

a NAND circuit for receiving said first control signal and said internal read data signal to generate an output signal;

an inverter for receiving said first control signal to generate an output signal;

a NOR circuit for receiving said internal read data and the output signal of said inverter to generate an output signal;

a P-channel MOS transistor having a source connected to a first power supply means, a gate for receiving the output signal of said NAND circuit, and a drain connected to said output terminal; and an N-channel MOS transistor having a source connected to a second power supply means lower than said first power supply means, a gate for receiving the output signal of said NOR circuit, and a drain connected to said output terminal.

3. A device as set forth in claim 1, wherein said second output buffer comprises:

a NAND circuit for receiving said second control signal and said identification code signal to generate an output signal;

an inverter for receiving said second control signal to generate an output signal;

a NOR circuit for receiving said identification code signal and the output signal of said inverter to generate an output signal;

a P-channel MOS transistor having a source connected to a first power supply means, a gate for receiving the output signal of said NAND circuit, and a drain connected to said output terminal; and an N-channel MOS transistor having a source connected to a second power supply means lower than said first power supply means, a gate for receiving the output signal of said NOR circuit, and a drain connected to said output terminal.

4. A device as set forth in claim 1, wherein said first output buffer comprises:

a first inverter for receiving said first control signal to generate an output signal;

a second inverter for receiving said internal read data signal to generate an output signal;

a first P-channel MOS transistor having a source connected to a first power supply means and a gate for receiving the output signal of said first inverter;

a second P-channel MOS transistor having a source connected to a drain of said first P-channel MOS transistor, a gate for receiving the output signal of said second inverter, and a drain connected to said output terminal;

a first N-channel MOS transistor having a source connected to a drain of said first N-channel MOS transistor, a gate for receiving the output signal of said second inverter, and a drain connected to said output terminal.

5. A device as set forth in claim 1, wherein said second output buffer comprises:

a first inverter for receiving said second control signal to generate an output signal;

a second inverter for receiving said identification code signal to generate an output signal;

a first P-channel MOS transistor having a source connected to a first power supply means, a gate for receiving the output signal of said first inverter, and a drain;

a second P-channel MOS transistor having a source connected to the drain of said first P-channel MOS transistor, a gate for receiving the output signal of said second inverter, and a drain connected to said output terminal;

a first N-channel MOS transistor having a source connected to a second power supply means lower than said first power supply means, a gate for receiving said second control signal, and a drain; and a second N-channel MOS transistor having a source connected to the drain of said first N-channel MOS transistor, a gate for receiving the output signal of said second inverter, and a drain connected to said output terminal.

6. A semiconductor device comprising:

a common output terminal;

a first output buffer having a first capacity, connected to said common output terminal, for receiving an identification code signal to transmit a first output signal in accordance with a logic value of the identification code signal to said common output terminal, said first output buffer being activated by a first control signal;

a second output buffer having a second capacity larger than the first capacity, connected to said common output terminal, for receiving an internal signal to transmit a second output signal in accordance with a logic value of the internal signal to said common output terminal, said second output buffer being activated by a second control signal; and an output control circuit, connected to said first and second output buffers, for selectively generating one of said first and second control signals, said output control circuit comprising:

a third NOR circuit for receiving a data output enable signal and a code output enable signal to generate said first control signal;

a fifth inverter for receiving said code output enable signal; and a fourth NOR circuit for receiving said data output enable signal and an output signal of said fifth inverter to generate said second control signal.

* * * * *

UNITED STATES PATENT AND TRADEMARK OFFICE
CERTIFICATE OF CORRECTION

PATENT NO. : 5,424,982
DATED : June 13, 1995
INVENTOR(S) : Yasushi KATO

It is certified that error appears in the above-indentified patent and that said Letters Patent is hereby corrected as shown below:

Col. 2, line 18, delete "$Q_F$" insert -- $Q_P$ --

Col. 4, line 21, delete "pas" insert -- pass --

Col. 4, line 44, delete the first occurence of "1A-0' (1B-0')" insert -- 1A-0 (1B-0) --

Signed and Sealed this

Twenty-first Day of November, 1995

*Attest:*

BRUCE LEHMAN

*Attesting Officer*     *Commissioner of Patents and Trademarks*